(12) United States Patent
Cheng et al.

(10) Patent No.: US 11,282,768 B2
(45) Date of Patent: Mar. 22, 2022

(54) FULLY-ALIGNED TOP-VIA STRUCTURES WITH TOP-VIA TRIM

(71) Applicant: INTERNATIONAL BUSINESS MACHINES CORPORATION, Armonk, NY (US)

(72) Inventors: Kenneth C. K. Cheng, Albany, NY (US); Koichi Motoyama, Clifton Park, NY (US); Brent A. Anderson, Jericho, VT (US); Joseph F. Maniscalco, Lake Katrine, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 173 days.

(21) Appl. No.: 16/677,983

(22) Filed: Nov. 8, 2019

(65) Prior Publication Data

US 2021/0143085 A1   May 13, 2021

(51) Int. Cl.
*H01L 23/48*    (2006.01)
*H01L 21/768*   (2006.01)
*H01L 21/311*   (2006.01)

(52) U.S. Cl.
CPC ...... *H01L 23/481* (2013.01); *H01L 21/31144* (2013.01); *H01L 21/7688* (2013.01); *H01L 21/76831* (2013.01); *H01L 21/76879* (2013.01); *H01L 21/76897* (2013.01)

(58) Field of Classification Search
CPC ............. H01L 21/76897; H01L 21/768; H01L 21/76885; H01L 23/481; H01L 23/5226; H01L 23/528
See application file for complete search history.

(56) References Cited

U.S. PATENT DOCUMENTS

| | | | |
|---|---|---|---|
| 6,210,866 B1 | 4/2001 | Furukawa et al. | |
| 8,114,769 B1 | 2/2012 | Srivastava et al. | |
| 8,299,625 B2 * | 10/2012 | Ponoth .................. | H01L 23/528 257/774 |
| 9,107,291 B2 | 8/2015 | Cheng et al. | |
| 9,613,861 B2 | 4/2017 | Anderson et al. | |
| 9,646,883 B2 | 5/2017 | Brink et al. | |
| 9,984,919 B1 | 5/2018 | Zhang et al. | |
| 10,692,759 B2 * | 6/2020 | Jiang ................. | H01J 37/32981 |

(Continued)

*Primary Examiner* — Jose R Diaz
(74) *Attorney, Agent, or Firm* — Tutunjian & Bitetto, P.C.; Randall Bluestone

(57) ABSTRACT

A method is presented for constructing fully-aligned top-via interconnects by employing a subtractive etch process. The method includes building a first metallization stack over a substrate, depositing a first lithography stack over the first metallization stack, etching the first lithography stack and the first metallization stack to form a receded first metallization stack, and depositing a first dielectric adjacent the receded first metallization stack. The method further includes building a second metallization stack over the first dielectric and the receded first metallization stack, depositing a second lithography stack over the second metallization stack, etching the second lithography stack and the second metallization stack to form a receded second metallization stack, and trimming the receded first metallization stack to form a via connecting the receded first metallization stack to the receded second metallization stack.

17 Claims, 12 Drawing Sheets

(56) References Cited

U.S. PATENT DOCUMENTS

2015/0056800 A1    2/2015   Mebarki et al.
2015/0171010 A1    6/2015   Bristol et al.
2016/0111329 A1    4/2016   Zhang et al.

\* cited by examiner

FULLY-ALIGNED TOP-VIA STRUCTURES WITH TOP-VIA TRIM

BACKGROUND

The present invention relates generally to semiconductor devices, and more specifically, to fully-aligned top-via structures with top-via trim.

Integrated circuits commonly include electrically conductive microelectronic structures, known as vias, to electrically connect metal lines or other interconnects above the vias to metal lines or other interconnects below the vias. Vias are usually formed by a lithographic process. Representatively, a photoresist layer can be spin coated over a dielectric layer, the photoresist layer can be exposed to patterned actinic radiation through a patterned mask, and then the exposed layer can be developed in order to form an opening in the photoresist layer. Next, an opening for the via can be etched in the dielectric layer by using the opening in the photoresist layer as an etch mask. This opening is referred to as a via opening. The via opening can be filled with one or more metals or other conductive materials to form the via. Via opening misalignment, however, can cause a reduction in level-to-level contact area, thus increasing via resistance, which is undesirable.

SUMMARY

In accordance with an embodiment, a method is provided for constructing fully-aligned top-via interconnects by employing a subtractive etch process. The method includes building a first metallization stack over a substrate, depositing a first lithography stack over the first metallization stack, etching the first lithography stack and the first metallization stack to form a receded first metallization stack, depositing a first dielectric adjacent the receded first metallization stack, building a second metallization stack over the first dielectric and the receded first metallization stack, depositing a second lithography stack over the second metallization stack, etching the second lithography stack and the second metallization stack to form a receded second metallization stack, and trimming the receded first metallization stack to form a via connecting the receded first metallization stack to the receded second metallization stack.

In accordance with another embodiment, a method is provided for constructing fully-aligned top-via interconnects by employing a damascene process. The method includes constructing a conductive line within a first dielectric, recessing the conductive line, depositing a conductive cap over the conductive line, depositing a second dielectric, forming a first lithography stack over the second dielectric, and etching the first lithography stack to form an opening exposing a top surface of the conductive cap. The method further includes depositing a via metal in the opening and forming a barrier layer over the via metal, forming a first lithography stack over the barrier layer, etching the second lithography stack to form second openings within a third dielectric, filling the second openings with a conductive material, removing the third dielectric and the barrier layer to expose the top surface of the via metal, and trimming the via metal to form a via connecting the conductive line within the first dielectric to the conductive material.

In accordance with yet another embodiment, a semiconductor device is provided for constructing fully-aligned top-via interconnects by employing a subtractive etch process. The semiconductor structure includes a receded first metallization stack formed over a substrate, a receded second metallization stack formed over the receded first metallization stack, and a via disposed at a top portion of the receded first metallization stack for connecting the receded first metallization stack to the receded second metallization stack.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a fully-aligned top-via structure by employing a top-via trim. In top-via integration schemes, patterning misalignments often reduce level-to-level contact area, thus resulting in an increase in via resistance. Patterning misalignments can occur, e.g., when a hardmask is misaligned over a via metal. The exemplary embodiments of the present invention prevent patterning misalignments by employing a top-via trim methodology to build multi-level fully-aligned top-via structures. The exemplary methodology involves building "tall" or elongated lines and using lines above the hardmask to trim a top portion of the "tall" lines below the vias. The "tall" or elongated lines can be constructed by using subtractive etch-based or damascene-based integration schemes.

The exemplary embodiments of the present invention employ a top-via trim methodology that provides for a much larger process window to achieve accurate level-to-level top-via alignment, even in hardmask misalignment scenarios. The exemplary top-via trim methodology thus minimizes any via resistance and/or frequency degradation. In other words, even when the hardmask for creating the line above is misaligned, the line created will likely still land on the line below, such that the contact area is consistently the same. As a result, after the top-via trimming step, the contact area between the via and the line above/below will consistently be the same.

The exemplary embodiments of the present invention employ a top-via trim method that can create multi-level fully-aligned top-via structures. The method includes fabricating top-via structures with vias that are wider along the long axis of the lines, and subsequently trimming the vias after the level above is built to achieve full alignment between the via and the line above. The top-via trim method provides for a much larger process window to achieve accurate and satisfactory level-to-level top-via alignment such that via resistance and/or frequency degradation is minimized even in the case of hardmask misalignment.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
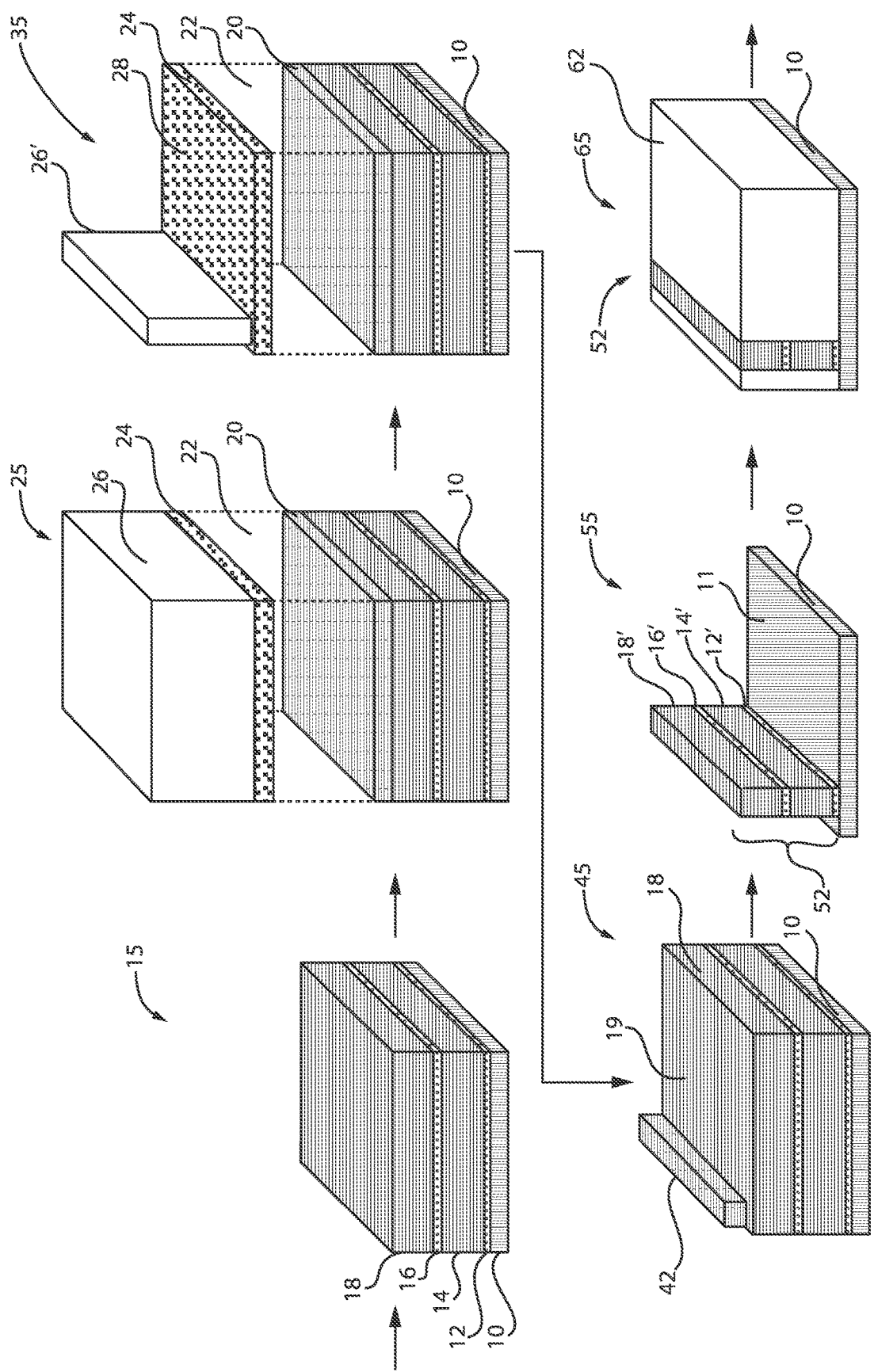
FIG. 1 is a process flow of a subtractive etch-based integration scheme with top-via trim where the M1/V1 stack is built, in accordance with an embodiment of the present invention.

FIG. 1 is a process flow of a subtractive etch-based integration scheme with top-via trim where the M1/V1 stack is built, in accordance with an embodiment of the present invention.

Structure 15 depicts an M1/V1 stack formed over a substrate 10. The M1/V1 stack includes an etch stop layer or barrier layer or nucleation layer 12. Layer 12 can be optional. A metal layer M1 (14) is deposited over the etch stop layer 12. A second etch stop layer or barrier layer or nucleation layer 16 can be deposited over the (M1) layer 14. Layer 16 can be optional. A V1 metal layer 18 can then be deposited over the etch stop layer 16. Layers 12, 14, 16, 18 can be referred to as the M1/V1 stack. M1 refers to a metallization or metallizing layer or metal line or connecting line. V1 refers to the via layer or via metal layer or via line. The M1/V1 stack can be referred to as a metallization stack.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The metal layers 14, 18 can be any conductive materials known in the art, such as, for example, copper (Cu), aluminum (Al), tungsten (W), ruthenium (Ru) or cobalt (Co). The metal lines 14, 18 can be fabricated using a subtractive etch technique. In an embodiment, the metal lines 14, 18 can be, e.g., copper (Cu).

In structure 25, a lithography stack can be deposited over the M1/V1 stack. The lithography stack can include a hardmask layer 20, an organic planarization layer (OPL) or organic dielectric layer (ODL) 22, an anti-reflective coating (ARC) layer 24, and a photoresist layer 26.

In various embodiments, the hardmask layer 20 can be a nitride, for example, a silicon nitride (SiN), an oxynitride, for example, silicon oxynitride (SiON), or a combination thereof. In a preferred embodiment, the hardmask layer 20 can be silicon nitride (SiN), for example, $Si_3N_4$.

In one or more embodiments, the hardmask layer 20 can have a thickness in the range of about 10 nm to about 100 nm, or in the range of about 35 nm to about 75 nm, or in the range of about 45 nm to about 55 nm, although other thicknesses are contemplated.

The OPL 22 and the ARC layer 24 can be employed as a lithographic stack to pattern the underlying layers. The OPL 22 is formed at a predetermined thickness to provide reflectivity and topography control during etching of the hard mask layers below. The OPL 22 can include an organic material, such as a polymer. The thickness of the OPL 22 can be in a range from about 10 nm to about 300 nm. In one example, the thickness of the OPL 22 is about 100 nm-150 nm.

The layer 24 is an ARC layer which minimizes the light reflection during lithography for a lithography stack. The ARC layer 24 can include silicon, for example, a silicon anti-reflective layer (SiARC). The thickness of the ARC layer 24 can be in range from about 1 nm to about 100 nm. The anti-reflective film layer 24 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 26 (e.g., a material that will react when exposed to light), and then selectively exposing portions of the photoresist 26 to light or other ionizing radiation (e.g., ultraviolet, electron beams, X-rays, etc.), thereby changing the solubility of portions of the material. The resist 26 is then developed by washing the resist with a developer solution, such as, e.g., tetramethylammonium hydroxide (TMAH), thereby removing non-irradiated (in a negative resist) or irradiated (in a positive resist) portions of the resist layer.

In structure 35, the resist 26 is etched to form a resist section 26'. The etching results in exposure of a top surface 28 of the ARC layer 24. The resist section 26' resembles a fin pattern.

In general, regarding the etching of any materials, such materials can be removed by a dry etching process, for example, ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide. In various example embodiments, the resist 26 is etched. The etch can, for example, include a wet etch such as a phosphoric acid ($H_3PO_4$) (wet chemistry) etch or a diluted hydrogen fluoride (HF) etch.

In structure 45, a reactive ion etch (RIE) can be employed to strip or remove the resist section 26', the ARC layer 24, the OPL 22, and most of the hardmask (HM) 20. This results in HM portion 42 remaining over the M1/V1 stack. HM portion 42 extends a vertical length of the M1/V1 stack. The etching results in the exposure of a top surface 19 of the V1 metal 18.

In structure 55, the M1/V1 stack is etched such that the HM portion 42 is removed and a truncated M1/V1 stack 52 remains. The M1/V1 stack includes layers 12', 14', 16', 18'. A top surface 11 of the substrate 10 is also exposed. The M1/V1 stack 52 is reduced or condensed or contracted or decreased or receded with respect to the original stack 12, 14, 16, 18, and can be referred to as, e.g., a receded M1/V1 stack.

In structure 65, a dielectric 62 is deposited adjacent the remaining or receded M1/V1 stack 52 such that top and side surfaces of the receded M1/V1 stack 52 remain exposed.

The ILD 62 can be formed using any method known in the art, such as, for example, chemical vapor deposition, plasma enhanced chemical vapor deposition, atomic layer deposition, or physical vapor deposition. The ILD 62 can have a thickness ranging from about 25 nm to about 200 nm.

The dielectric material of layer 62 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

One example of a material suitable for the low-k materials for the low-k dielectric layer 62 can include silicon oxycarbonitride (SiOCN). Other low-k materials that can also be used for the low-k material layer 62 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 62 can be conformally deposited using CVD. Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 2:
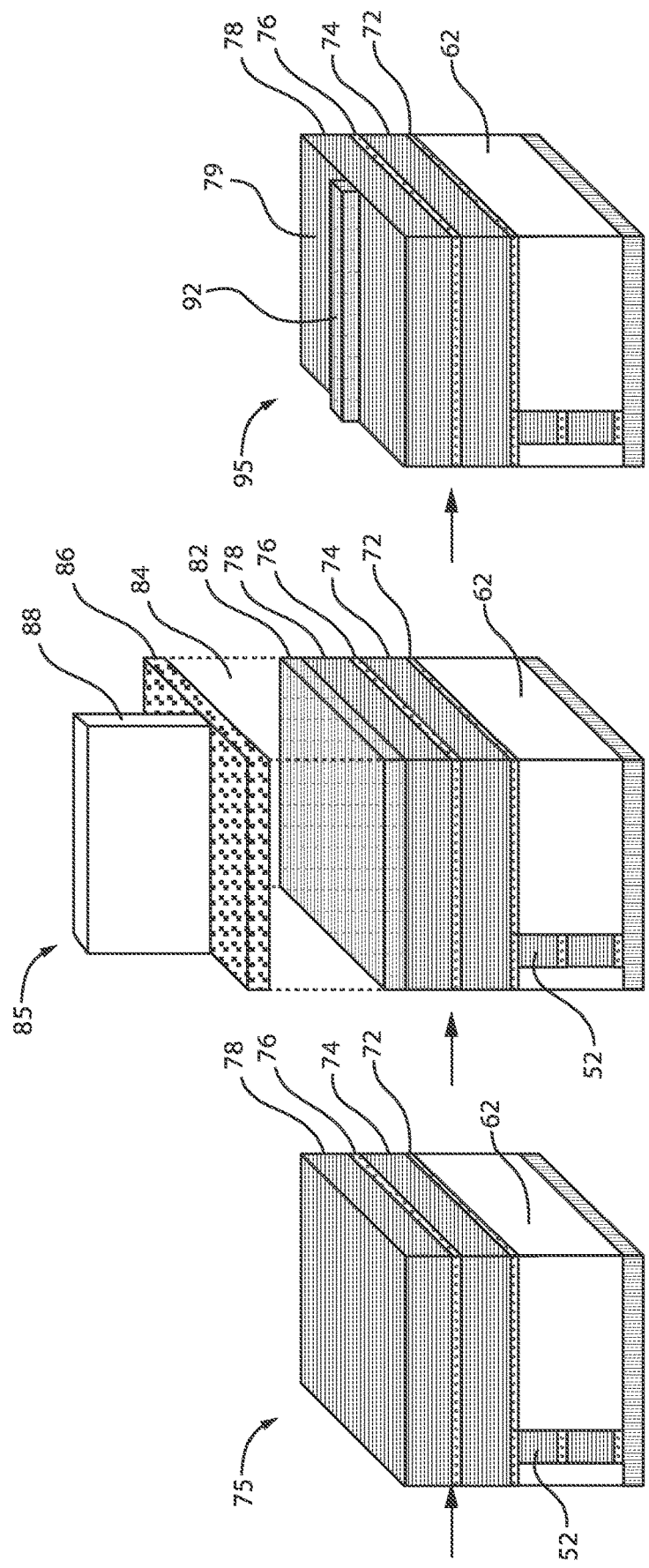
FIG. 2 is a continued process flow of the subtractive etch-based integration scheme of FIG. 1 with top-via trim where the M2/V2 stack is built, in accordance with an embodiment of the present invention.

FIG. 2 is a continued process flow of the subtractive etch-based integration scheme of FIG. 1 with top-via trim where the M2/V2 stack is built, in accordance with an embodiment of the present invention.

In structure 75, the M2/V2 stack is built. Structure 75 depicts an M2/V2 stack formed over structure 65. The M2/V2 stack includes an etch stop layer or barrier layer or nucleation layer 72. Layer 72 can be optional. A metal layer M2 (74) is deposited over the etch stop layer 72. A second etch stop layer or barrier layer or nucleation layer 76 can be deposited over the (M2) layer 74. Layer 76 can be optional. A V2 metal layer 78 can then be deposited over the etch stop layer 76. Layers 72, 74, 76, 78 can be referred to as the M2/V2 stack. M2 refers to a metallization or metallizing layer or metal line or connecting line. V2 refers to the via layer or via metal layer or via line. The M2/V2 stack can be referred to as a metallization stack.

In structure 85, a lithography stack can be deposited over the M2/V2 stack. The lithography stack can include a hardmask layer 82, an organic planarization layer (OPL) or organic dielectric layer (ODL) 84, an anti-reflective coating (ARC) layer 86, and a photoresist layer 88.

The OPL 84 can include an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the OPL 84 forms a planar horizontal surface. Exemplary organic planarization materials include, but are not limited to, near-frictionless carbon (NFC) material, diamond-like carbon, polyarylene ether, and polyimide. The OPL 84 can be deposited, for example, by spin coating. The thickness of the OPL 84 can be from about 100 nm to about 500 nm, although lesser and greater thicknesses can also be employed.

The antireflective hard mask layer 86 is formed on the OPL 84. The antireflective hard mask layer 86 can include an antireflective coating material. The antireflective hard mask layer 86 is employed in the lithographic process to improve the photoresist profile and to reduce the line width variation caused by scattering and reflecting light. The antireflective hard mask layer 86 can include a silicon-containing antireflective coating (SiARC) material, a titanium-containing antireflective coating material (TiARC), silicon nitride, silicon oxide or TiN. In one embodiment, the antireflective hard mask layer 86 includes a SiARC material. The antireflective hard mask layer 86 can be applied, for example, by spin coating or CVD. The thickness of the antireflective hard mask layer 86 can be from about 10 nm to about 150 nm, although lesser and greater thicknesses can also be employed.

A photoresist layer 88 is deposited as a blanket layer atop the antireflective hard mask layer 86, for example, by spin coating. The photoresist layer 88 can include any organic photoresist material such as, for example, methacrylates or polyesters. The photoresist layer 88 can have a thickness from about 30 nm to about 500 nm, although lesser and greater thicknesses can also be employed. The photoresist layer 88 resembles a fin pattern extending horizontally across the antireflective hard mask layer 86.

In structure 95, a reactive ion etch (RIE) can be employed to strip or remove the photoresist layer 88, the ARC layer 86, the OPL 84, and most of the hardmask (HM) 82. This results in HM portion 92 remaining over the M2/V2 stack. HM portion 92 extends a horizontal length of the M2/V2 stack. The etching results in the exposure of a top surface 79 of the V2 metal 78.

Figure 3:
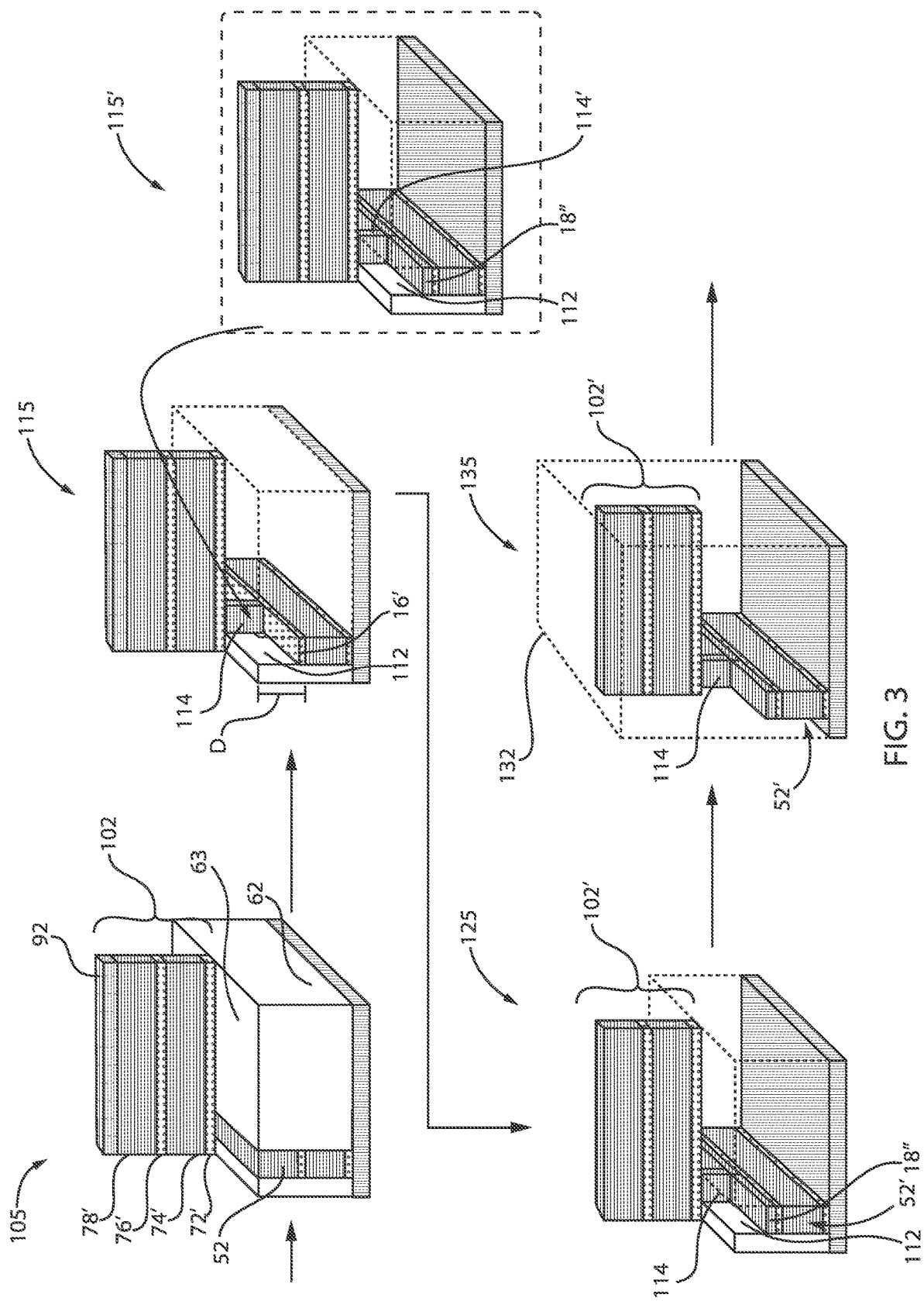
FIG. 3 is a continued process flow of the subtractive etch-based integration scheme of FIGS. 1 and 2 with top-via trim where the top-via trim is created, in accordance with an embodiment of the present invention.

FIG. 3 is a continued process flow of the subtractive etch-based integration scheme of FIGS. 1 and 2 with top-via trim where the top-via trim is created, in accordance with an embodiment of the present invention.

In structure 105, the M2/V2 stack is etched to form receded stack 102. Stack 102 includes layers 72', 74', 76', 78'. Layer 72' is the optional etch stop layer, layer 74' is the metal layer M2, layer 76' is the optional etch stop layer, layer 78' is the V2 metal layer, and layer 92 is the HM portion. The etch results in exposure of a top surface 63 of the dielectric 62. It is noted that a top surface of the receded M1/V1 stack 52 is exposed. Thus, side surfaces and portions of a top surface of the receded M1/V1 stack 52 are exposed. It is noted that the receded M1/V1 stack 52 is offset by 90 degrees from the receded M2/V2 stack 102. Stated differently, the receded M1/V1 stack 52 is perpendicular to the receded M2/V2 stack 102. The receded M1/V1 stack 52 extends a vertical length of the dielectric 62, whereas the receded M2/V2 stack extends a horizontal length of the dielectric 62.

In structure 115, a top-via trim takes place. In other words, an etch takes place to remove the V1 metal 18' from the receded M1/V1 stack 52. Thus, a via 114 is formed that connects the M1 layer to the M2 layer. The recess can be designated by distance "D." The recess forms an opening or gap 112 adjacent the via 114. Thus, the optional etch stop layer 16' is exposed.

Thus, the method includes fabricating top-via structures with vias that are wider along the long axis of the lines, and subsequently trimming the vias after the level above is built to achieve full alignment between the via and the line above. The top-via trim method provides for a much larger process window to achieve accurate and satisfactory level-to-level top-via alignment such that via resistance and/or frequency degradation is minimized even in the case of hardmask misalignment.

In an alternative embodiment, in structure 115', the etch can be a partial etch. In other words, an etch takes place to recess the V1 metal 18' in the receded M1/V1 stack 52. Thus, a via 114' is formed (by the trimming of the V1 metal) that connects the M1 layer to the M2 layer. The recess forms an opening or gap 112 adjacent the via 114'. Thus, a recessed V1 metal 18" remains exposed after the partial etch. Either way, whether a full etch or a partial etch takes place, shorting to adjacent lines is avoided and via resistance is improved. Also, the via 114, 114' is fully aligned to both the line above and the line below.

In structure 125, the HM portion 92 is removed to form stack 102'. Additionally, the remaining M1/V1 stack 52' is illustrated where there is a partial etch.

In structure 135, a dielectric 132 is deposited to cover or encompass the receded M1/V1 stack 52 and the receded M2/V2 stack 102'. The dielectric 132 can be planarized. Planarization can be performed by, e.g., chemical mechanical polishing (CMP). The process is repeated to build the next levels (e.g., M3/V3, M4/V4, etc.).

Figure 4:
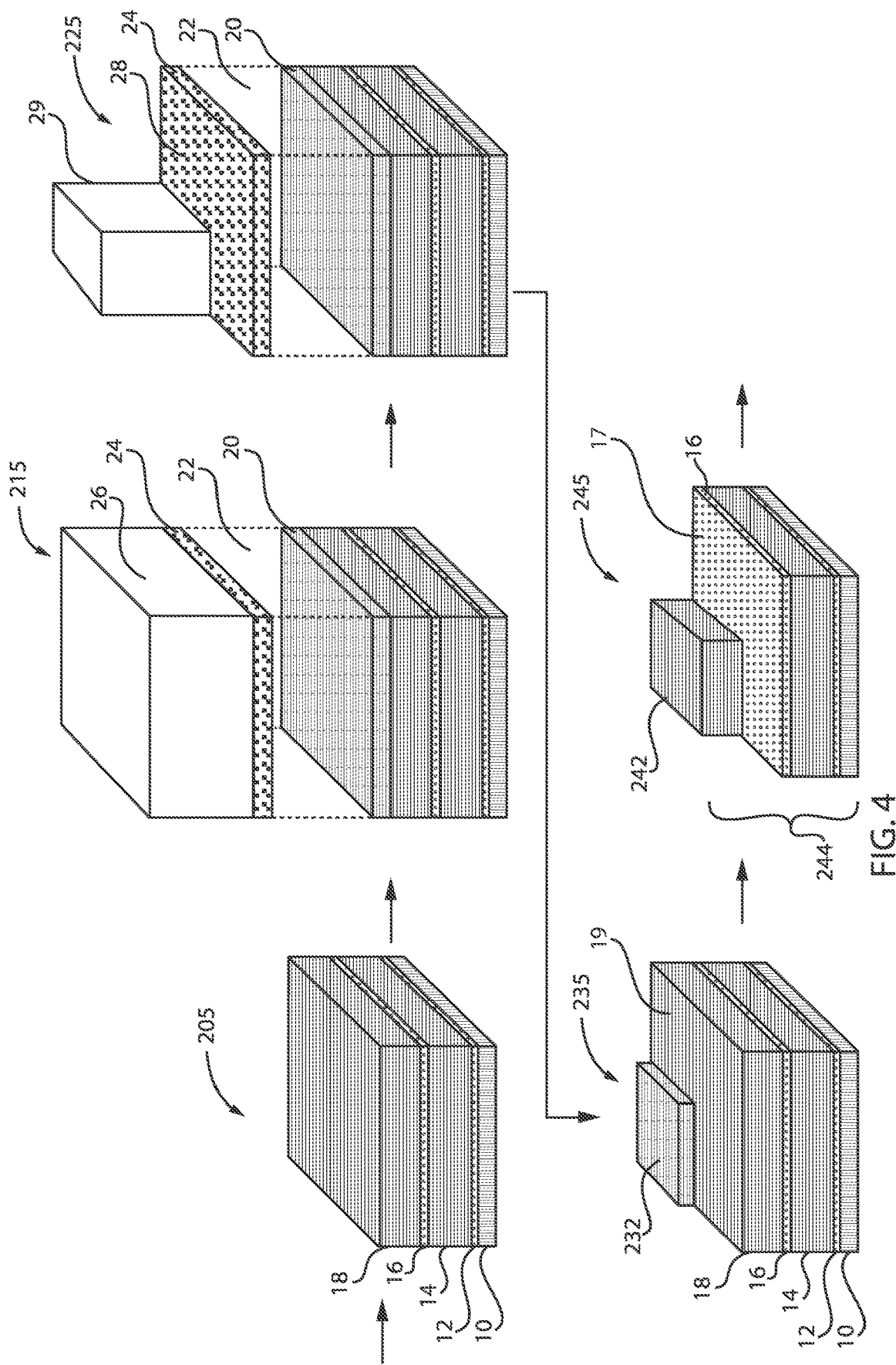
FIG. 4 is a process flow of a subtractive etch-based integration scheme with top-via trim where the M1/V1 stack is built, in accordance with another embodiment of the present invention.

FIG. 4 is a process flow of a subtractive etch-based integration scheme with top-via trim where the M1/V1 stack is built, in accordance with another embodiment of the present invention.

Structure 205 depicts an M1/V1 stack formed over a substrate 10. The M1/V1 stack includes an etch stop layer or barrier layer or nucleation layer 12. Layer 12 can be optional. A metal layer M1 (14) is deposited over the etch stop layer 12. A second etch stop layer or barrier layer or nucleation layer 16 can be deposited over the (M1) layer 14. Layer 16 can be optional. A V1 metal layer 18 can then be deposited over the etch stop layer 16. Layers 12, 14, 16, 18 can be referred to as the M1/V1 stack.

In structure 215, a lithography stack can be deposited over the M1/V1 stack. The lithography stack can include a hardmask layer 20, an organic planarization layer (OPL) or organic dielectric layer (ODL) 22, an anti-reflective coating (ARC) layer 24, and a photoresist layer 26.

In structure 225, the resist 26 is etched to form a resist section 29. The etching results in exposure of a top surface 28 of the ARC layer 24. The resist section 29 resembles a rectangle or square, as opposed to a fin pattern as in structure 35 of FIG. 1.

In structure 235, a reactive ion etch (RIE) can be employed to strip or remove the resist section 29, the ARC layer 24, the OPL 22, and most of the hardmask (HM) 20. This results in HM portion 232 remaining over the M1/V1 stack. HM portion 232 is formed on a corner portion or section of the M1/V1 stack. The etching results in the exposure of a top surface 19 of the V1 metal 18.

In structure 245, the M1/V1 stack is etched such that the HM portion 232 is removed and the a M1/V1 stack 244 remains. The M1/V1 stack 244 includes a V2 metal portion 242. The M1/V1 stack thus includes layers 12, 14, 16, 242. A top surface 17 of the optional etch stop layer 16 is also exposed.

Figure 5:
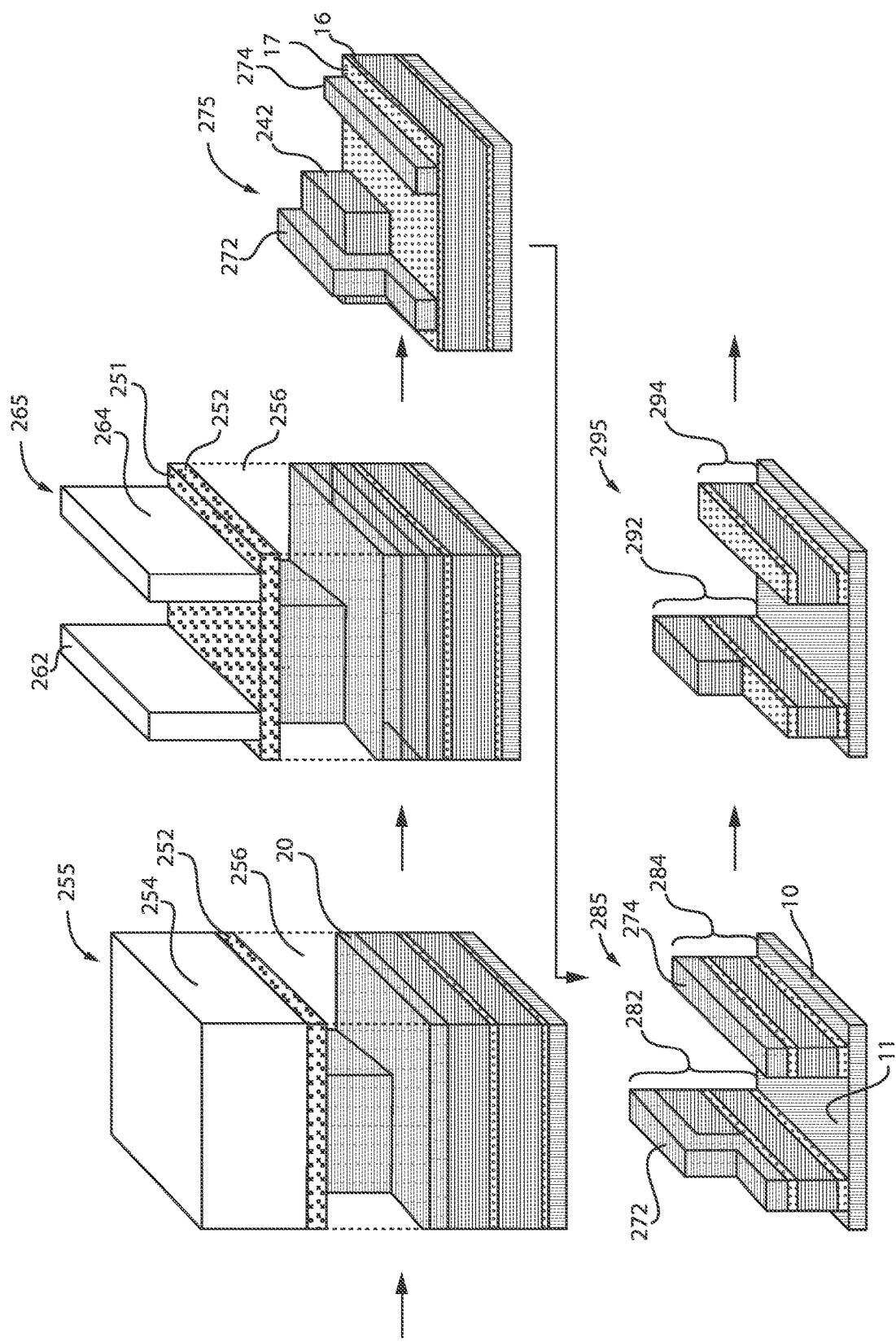
FIG. 5 is a continued process flow of the subtractive etch-based integration scheme of FIG. 4 with top-via trim where the M1/V1 stack is built, in accordance with an embodiment of the present invention.

FIG. 5 is a continued process flow of the subtractive etch-based integration scheme of FIG. 4 with top-via trim where the M1/V1 stack is built, in accordance with an embodiment of the present invention.

In structure 255, a lithography stack can be deposited over the M1/V1 stack 244. The lithography stack can include an organic planarization layer (OPL) or organic dielectric layer (ODL) 256, an anti-reflective coating (ARC) layer 252, and a photoresist layer 254.

In structure 265, the photoresist layer 254 is etched to form first and second photoresist sections 262, 264, as well as expose a top surface 251 of the ARC layer 252. The first and second photoresist sections 262, 264 can define or resemble fin patterns. The first and second photoresist sections 262, 264 can be parallel to each other. The first and second photoresist sections 262, 264 can extend a vertical length of the ARC layer 252.

In structure 275, a reactive ion etch (RIE) can be employed to strip or remove the first and second photoresist sections 262, 264, the ARC layer 252, the OPL 256, and most of the hardmask (HM) 20. This results in HM portions 272, 274 remaining over the M1/V1 stack. HM portions 272, 274 extend a vertical length of the M1/V1 stack. The etching results in the exposure of a top surface 17 of the optional etch stop layer 16.

The HM portion 272 has a stepped configuration formed over and in direct contact with the V2 metal portion 242 and the HM portion 274 has a substantially straight configuration extending over the optional etch stop layer 16. The HM portions 272, 274 are parallel to each other. The stepped configuration can be a substantially "Z"-shaped configuration.

In structure 285, the M1/V1 stack is etched to form a first truncated M1/V1 stack 282 and a second truncated M1/V1 stack 284. The truncated M1/V1 stack 282 include layers 12, 14, 16, 242, 272, whereas the truncated M1/V1 stack 284 includes layers 12, 14, 16, 274. Thus, the second stack 284 does not include a V1 metal layer. A top surface 11 of the substrate 10 is also exposed.

In structure 295, the HM portions 272, 274 are removed from the stacks 282, 284. Thus, remaining or receded M1/V1 stack 292 is formed and remaining or receded M1/V1 stack 294 are formed. Stack 292 is parallel to stack 294. Stacks 292 and 294 directly contact a top surface of the substrate 10. Stacks 292, 294 can be referred to as a dual fin structure or pattern or configuration.

Figure 6:
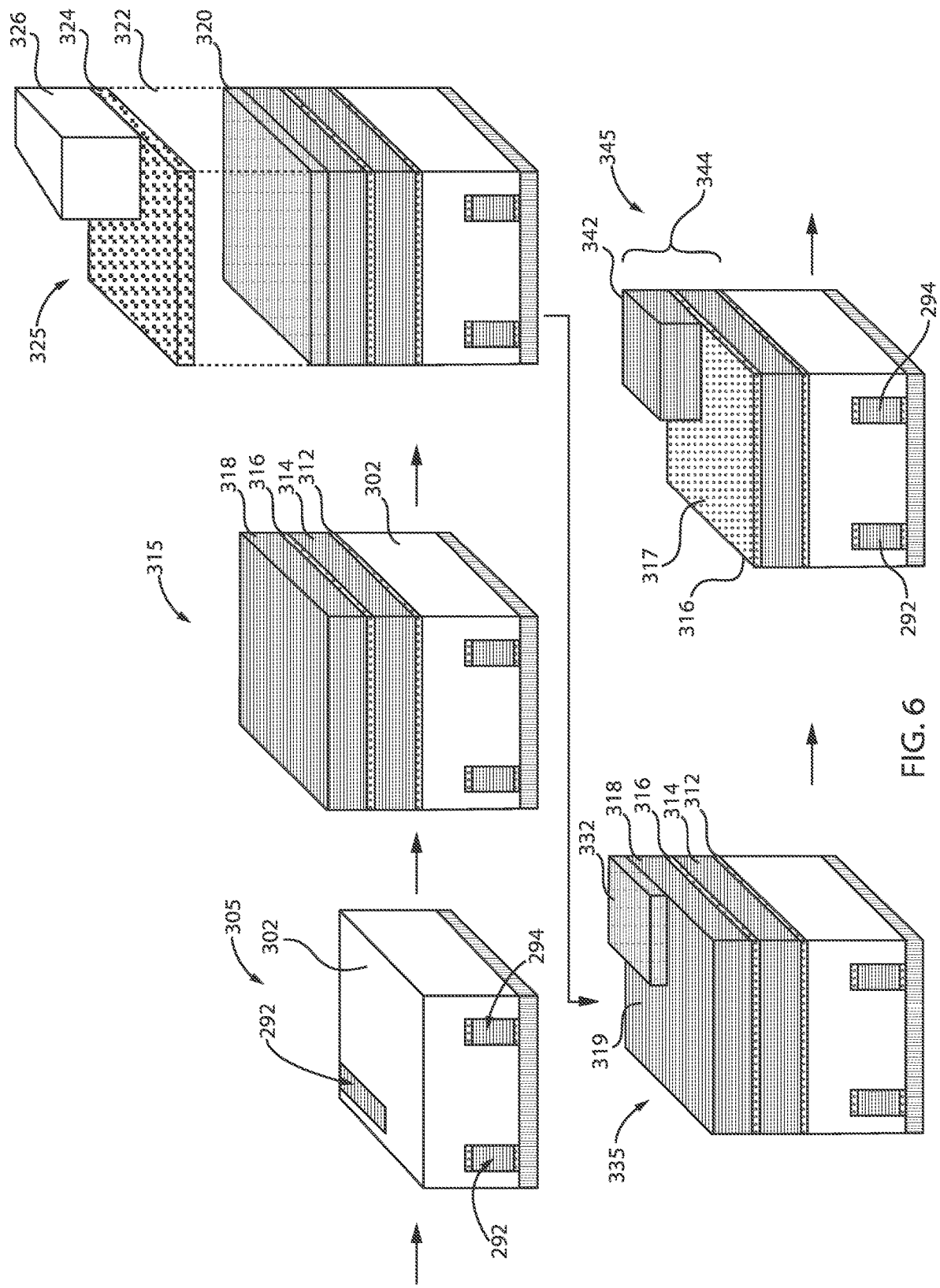
FIG. 6 is a continued process flow of the subtractive etch-based integration scheme of FIGS. 4 and 5 with top-via trim where the M2/V2 stack is built, in accordance with an embodiment of the present invention.

FIG. 6 is a continued process flow of the subtractive etch-based integration scheme of FIGS. 4 and 5 with top-via trim where the M2/V2 stack is built, in accordance with an embodiment of the present invention.

In structure 305, a dielectric 302 is deposited adjacent the remaining or receded M1/V1 stacks 292, 294 such that a top surface and side surfaces of the receded M1/V1 stack 292 remain exposed, as well as side surface only of the receded M1/V1 stack 294.

In structure 315, the M2/V2 stack is built. Structure 315 depicts an M2/V2 stack formed over structure 305. The M2/V2 stack includes an etch stop layer or barrier layer or nucleation layer 312. Layer 312 can be optional. A metal layer M2 (314) is deposited over the etch stop layer 312. A second etch stop layer or barrier layer or nucleation layer 316 can be deposited over the (M2) layer 314. Layer 316 can be optional. A V2 metal layer 318 can then be deposited over the etch stop layer 316. Layers 312, 314, 316, 318 can be referred to as the M2/V2 stack.

In structure 325, a lithography stack can be deposited over the M2/V2 stack. The lithography stack can include a hardmask layer 320, an organic planarization layer (OPL) or organic dielectric layer (ODL) 322, an anti-reflective coating (ARC) layer 324, and a photoresist layer 326. The resist layer 326 can be etched to form a rectangle or square portion at a corner of the ARC layer 324.

In structure 335, a reactive ion etch (RIE) can be employed to strip or remove the photoresist layer 326, the ARC layer 324, the OPL 322, and most of the hardmask (HM) 320. This results in HM portion 332 remaining over the M2/V2 stack. HM portion 332 is defined at a corner of the M2/V2 stack. The etching results in the exposure of a top surface 319 of the V2 metal 318.

In structure 345, the M2/V2 stack is etched to form stack 344. Stack 344 includes layers 312, 314, 316, 342. Layer 312 is the optional etch stop layer, layer 314 is the metal layer M2, layer 316 is the optional etch stop layer, and layer 342 is the V2 metal layer that remains. The etch results in exposure of a top surface 317 of the etch stop layer 316.

Figure 7:
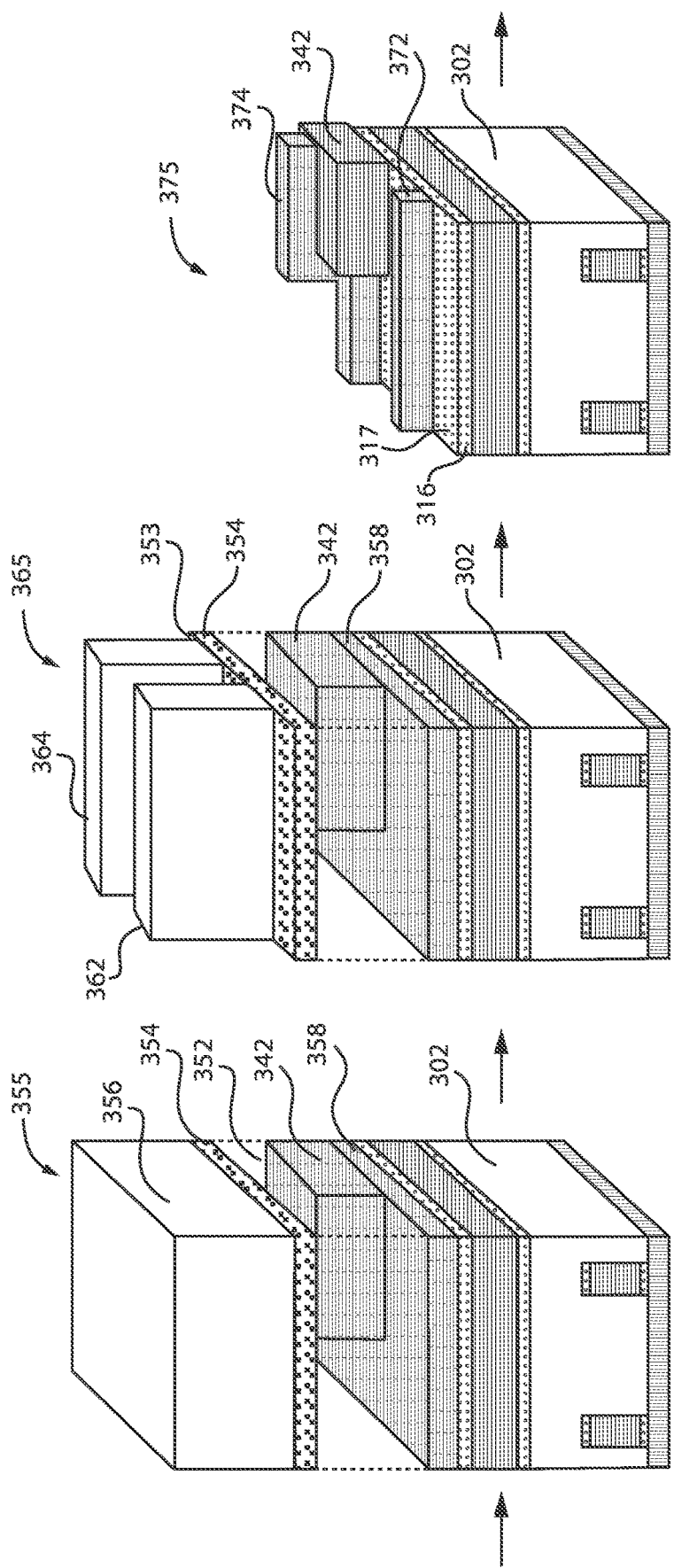
FIG. 7 is a continued process flow of the subtractive etch-based integration scheme of FIGS. 4, 5, and 6 with top-via trim where the M2/V2 stack is built, in accordance with an embodiment of the present invention.

FIG. 7 is a continued process flow of the subtractive etch-based integration scheme of FIGS. 4, 5, and 6 with top-via trim where the M2/V2 stack is built, in accordance with an embodiment of the present invention.

In structure 355, a lithography stack can be deposited over the M2/V2 stack 344. The lithography stack can include a hardmask layer 358, an organic planarization layer (OPL) or organic dielectric layer (ODL) 352, an anti-reflective coating (ARC) layer 354, and a photoresist layer 356.

In structure 365, the photoresist layer 356 is etched to form first and second photoresist sections 362, 364, as well as expose a top surface 353 of the ARC layer 354. The first and second photoresist sections 362, 364 can define or resemble fin patterns. The first and second photoresist sections 362, 364 can be parallel to each other. The first and second photoresist sections 362, 364 can extend a vertical length of the ARC layer 354. The first and second photoresist sections 362, 364 can be referred to as dual fins patterns or structures.

In structure 375, a reactive ion etch (RIE) can be employed to strip or remove the first and second photoresist sections 362, 364, the ARC layer 354, the OPL 352, and most of the hardmask (HM) 358. This results in HM portions 372, 374 remaining over the M2/V2 stack. HM portions 372, 374 extend a horizontal length of the M2/V2 stack. The etching results in the exposure of a top surface 317 of the optional etch stop layer 316.

The HM portion 374 has a stepped configuration formed over and in direct contact with the V2 metal portion 342 and the HM portion 372 has a substantially straight configuration extending over the optional etch stop layer 16. The HM portions 372, 374 are parallel to each other. The stepped configuration can be a substantially "Z"-shaped configuration.

Figure 8:
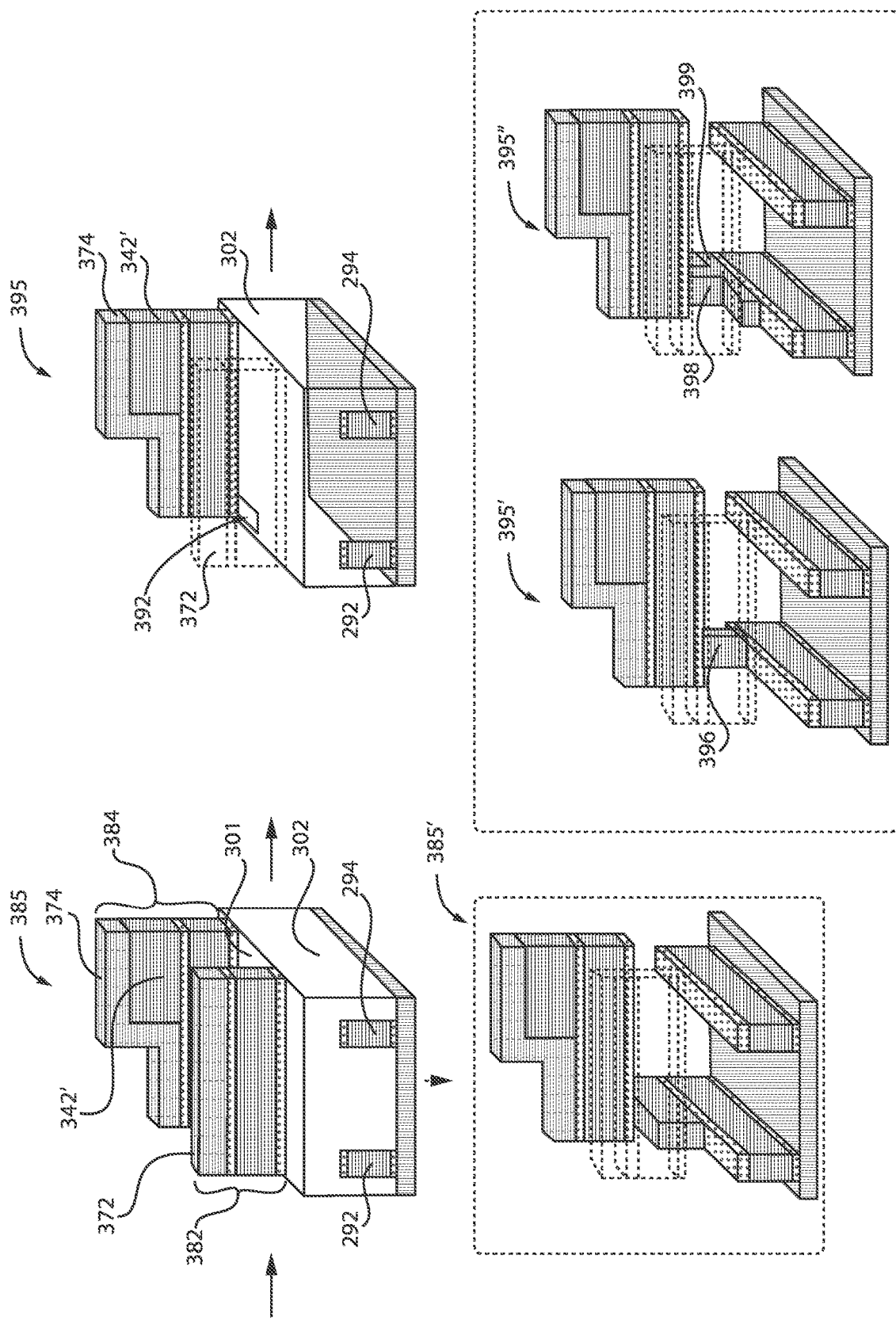
FIG. 8 is a continued process flow of the subtractive etch-based integration scheme of FIGS. 4, 5, 6, and 7 with top-via trim where the top-via trim is created, in accordance with an embodiment of the present invention.

FIG. 8 is a continued process flow of the subtractive etch-based integration scheme of FIGS. 4, 5, 6, and 7 with top-via trim where the top-via trim is created, in accordance with an embodiment of the present invention.

In structure 385, the M2/V2 stack is etched to form a first receded M2/V2 stack 382 and a second receded M2/V2 stack 384. The receded M2/V2 stack 282 include layers 312, 314, 316, 372, whereas the receded M2/V2 stack 384 includes layers 312, 314, 316, 342', 374. Thus, the first stack 382 does not include a V2 metal layer. Instead, only the second stack 384 includes a V2 metal layer 342'. A top surface 301 of the dielectric 302 is also exposed.

In structure 395, a top-via trim 392 takes place. In other words, an etch takes place to remove the V2 metal 342 from the M2/V2 stack 344. Thus, a via 396 is formed that connects the M1 layer to the M2 layer. Structure 395' illustrates the connection (via 396) between the M1 layer and the M2 layer when the dielectric 302 is removed.

In an alternative embodiment, in structure 395", the etch can be a partial etch. In other words, an etch takes place to recess the V2 metal 384 in the M2/V2 stack 344. Thus, a via 398 is formed (by the trimming of the V1 metal) that connects the M1 layer to the M2 layer. The via 398 is fully aligned to both the line above and the line below.

Thus, a recessed V2 metal 399 remains exposed after the partial etch. Either way, whether a full etch or a partial etch takes place, shorting to adjacent lines is avoided and via resistance is improved.

Thus, the method includes fabricating top-via structures with vias that are wider along the long axis of the lines, and subsequently trimming the vias after the level above is built to achieve full alignment between the via and the line above. The top-via trim method provides for a much larger process window to achieve accurate and satisfactory level-to-level top-via alignment such that via resistance and/or frequency degradation is minimized even in the case of hardmask misalignment.

It is noted that structure 385' depicts the structure 382 without the dielectric 302 to better visualize the relationship between the metals layers M1 and M2.

Figure 9:
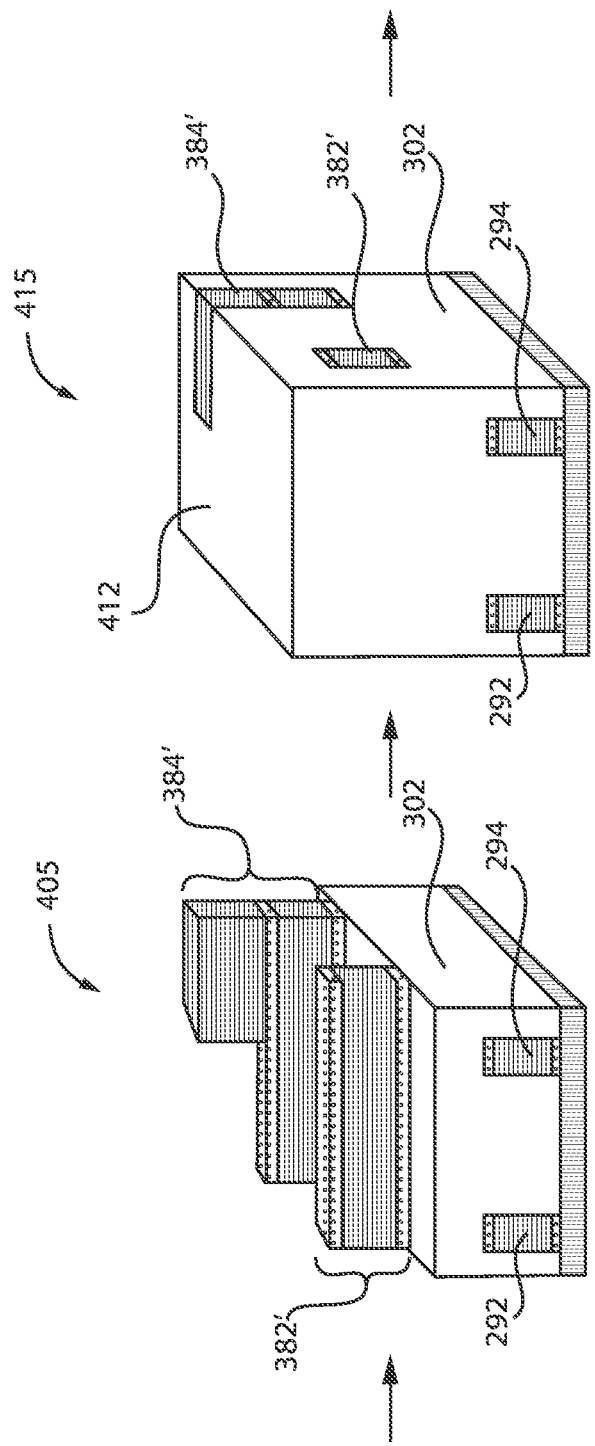
FIG. 9 is a continued process flow of the subtractive etch-based integration scheme of FIGS. 4, 5, 6, 7, and 8 with top-via trim where the top-via structure is completed, in accordance with an embodiment of the present invention.

FIG. 9 is a continued process flow of the subtractive etch-based integration scheme of FIGS. 4, 5, 6, 7, and 8 with top-via trim where the top-via structure is completed, in accordance with an embodiment of the present invention.

In structure 405, the HM portions 372, 374 are removed from the stacks 382, 384. Thus, remaining or receded M2/V2 stack 382' is formed and remaining or receded M2/V2 stack 384' are formed. Stack 382' is parallel to stack 384'. Stacks 382' and 384' directly contact a top surface of the dielectric 302.

In structure 415, a dielectric 412 is deposited adjacent the remaining or receded M2/V2 stacks 382', 384' such that a top surface and side surfaces of the receded M2/V2 stack 384' remain exposed, as well as side surface only of the receded M2/V2 stack 382'. Thus, the receded M1/V1 stack 292 and the receded M1/V1 stack 294 extend vertically over the substrate 10, whereas the receded M2/V2 stack 382' and the receded M2/V2 stack 384' extend horizontally over the substrate 10. The receded M1/V1 stacks 292, 294 are configured to be perpendicular to the receded M2/V2 stacks 392', 394'.

The dielectric 412 is deposited to cover or encompass the receded M2/V2 stacks 382', 384'. The dielectric 412 can be planarized. Planarization can be performed by, e.g., chemical mechanical polishing (CMP). The process is repeated to build the next levels (e.g., M3/V3, M4/V4, etc.).

Figure 10:
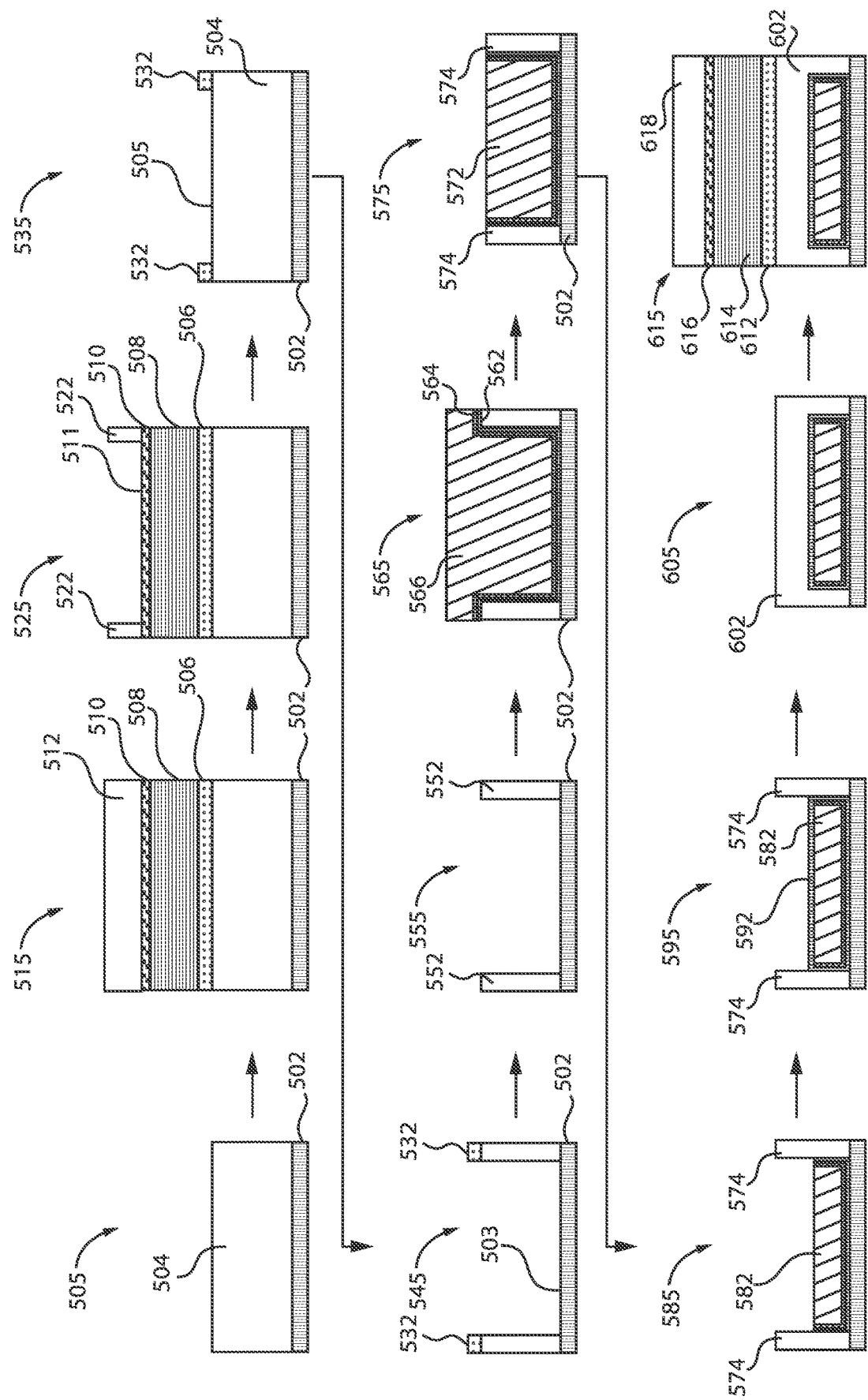
FIG. 10 is a process flow of a damascene-based integration scheme with top-via trim to create fully-aligned top-via interconnects where the M1/V1 stack is built, in accordance with another embodiment of the present invention.

FIG. 10 is a process flow of a damascene-based integration scheme with top-via trim to create fully-aligned top-via interconnects where the M1/V1 stack is built, in accordance with another embodiment of the present invention.

In structure 505, a dielectric 504 is deposited over a substrate 502. The dielectric 504 can be, e.g., an ultra-low-k (ULK) dielectric.

In structure 515, a lithography stack can be deposited over the dielectric 504. The lithography stack can include a hardmask layer 506, an organic planarization layer (OPL) or organic dielectric layer (ODL) 508, an anti-reflective coating (ARC) layer 510, and a photoresist layer 512.

In structure 525, the photoresist layer 512 is etched to expose a top surface 511 of the ARC layer 510 and to form resist sections 522.

In structure 535, a reactive ion etch (RIE) can be employed to strip or remove the resist sections 522, the ARC layer 510, the OPL 508, and most of the hardmask (HM) 506. This results in HM portions 532 remaining over the dielectric 504. A top surface 505 of the dielectric 504 is exposed.

In structure 545, the dielectric 504 is etched to expose a top surface 503 of the substrate 502. The HM portions 532 remain intact.

In structure 555, the HM portions 532 are removed. This results in dielectric portions 552 remaining over the substrate 502.

In structure 565, a barrier layer 562, a liner 564, and a conductive material 566 are deposited.

The conductive material 566 can be any conductive materials known in the art, such as, for example, copper (Cu), aluminum (Al), tungsten (W), ruthenium (Ru) or cobalt (Co). The conductive material 566 can be fabricated using any technique known in the art, such as, for example, a single or dual damascene technique. In an embodiment, the conductive material 566 can be copper (Cu) and can include a metal liner 564, where the metal liner 564 can be metals, such as, for example, tantalum nitride and tantalum (TaN/Ta), titanium, titanium nitride, cobalt, ruthenium, and manganese.

In one example, the metal liner 564 can be a tantalum nitride (TaN) liner or in the alternative a tantalum (Ta) liner. In one example embodiment, the metal liner 564 can be deposited, for example, by electroplating, electroless plating, chemical vapor deposition (CVD), atomic layer deposition (ALD) and/or physical vapor deposition (PVD).

In structure 575, the conductive material 566 is planarized such that a "tall" or elongated metal line 572 is formed. The planarization results in dielectric sections 574. Metal line 572 can be designated as the "M1" layer.

In structure 585, the barrier layer 562, the metal liner 564, and the "tall" or elongated metal line 572 are recessed such that metal line 582 remains (recessed M1 layer).

In structure 595, a conductive cap 592 is deposited over the metal line 582.

In structure 605, another a dielectric 602 is deposited. The dielectric 602 can be the same or different material than dielectric 504.

In structure 615, a lithography stack can be deposited over the dielectric 602. The lithography stack can include a hardmask layer 612, an organic planarization layer (OPL) or organic dielectric layer (ODL) 614, an anti-reflective coating (ARC) layer 616, and a photoresist layer 618.

Figure 11:
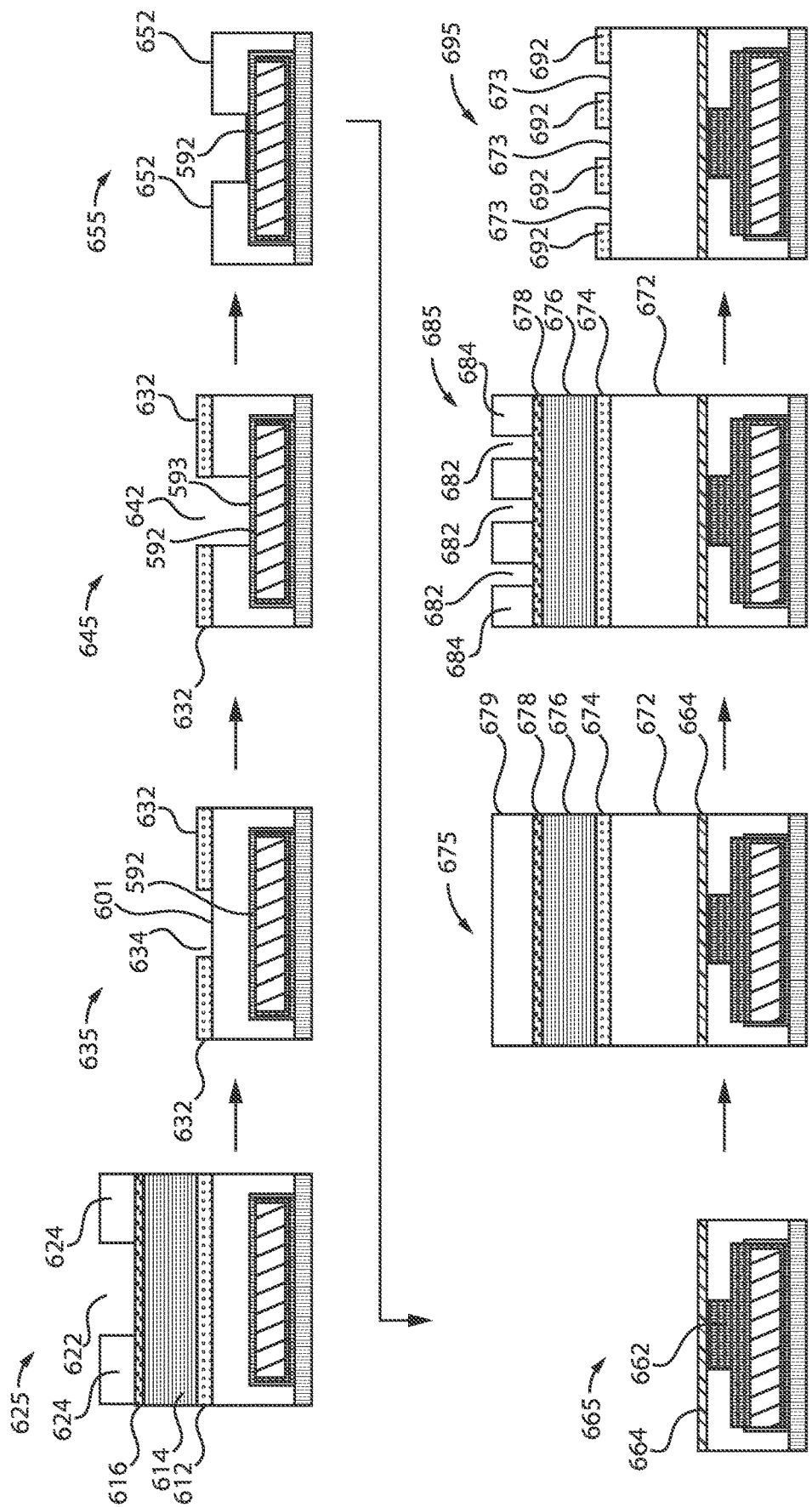
FIG. 11 is a continued process flow of the damascene-based integration scheme of FIG. 10 with top-via trim to create fully-aligned top-via interconnects where the M2/V2 stack is built, in accordance with an embodiment of the present invention.

FIG. 11 is a continued process flow of the damascene-based integration scheme of FIG. 10 with top-via trim to create fully-aligned top-via interconnects where the M2/V2 stack is built, in accordance with an embodiment of the present invention.

In structure 625, the photoresist layer 618 is etched to expose a top surface of the ARC layer 616. The etching results in opening 622 between resist sections 624.

In structure 635, a reactive ion etch (RIE) can be employed to strip or remove the resist sections 624, the ARC layer 616, the OPL 614, and most of the hardmask (HM) 612. This results in HM portions 632 remaining over the dielectric 602. A top surface 601 of the dielectric 602 is exposed. Additionally, an opening 634 is created adjacent the HM portions 632.

In structure 645, the dielectric 602 is etched to form opening 642 and to expose a top surface 593 of the conductive cap 592.

In structure 655, the HM portions 632 are removed to reveal the dielectric sections 652.

In structure 665, a V1 metal fill 662 takes place and an NBLOK cap 664 is deposited. The metal fill can be the V1 layer which will be subsequently trimmed to form a via.

In structure 675, a dielectric 672 and a lithography stack can be deposited over the NBLOK cap 664. The lithography stack can include a hardmask layer 674, an organic planarization layer (OPL) or organic dielectric layer (ODL) 676, an anti-reflective coating (ARC) layer 678, and a photoresist layer 679. The lithography stack will enable the formation of the M2 layer.

In structure 685, the photoresist layer 679 is etched to form openings 682 between resist sections 684.

In structure 695, a reactive ion etch (RIE) can be employed to strip or remove the resist sections 684, the ARC layer 678, the OPL 676, and most of the hardmask (HM) 674. This results in HM portions 692 remaining over the dielectric 672. A top surface 673 of the dielectric 672 is exposed.

Figure 12:
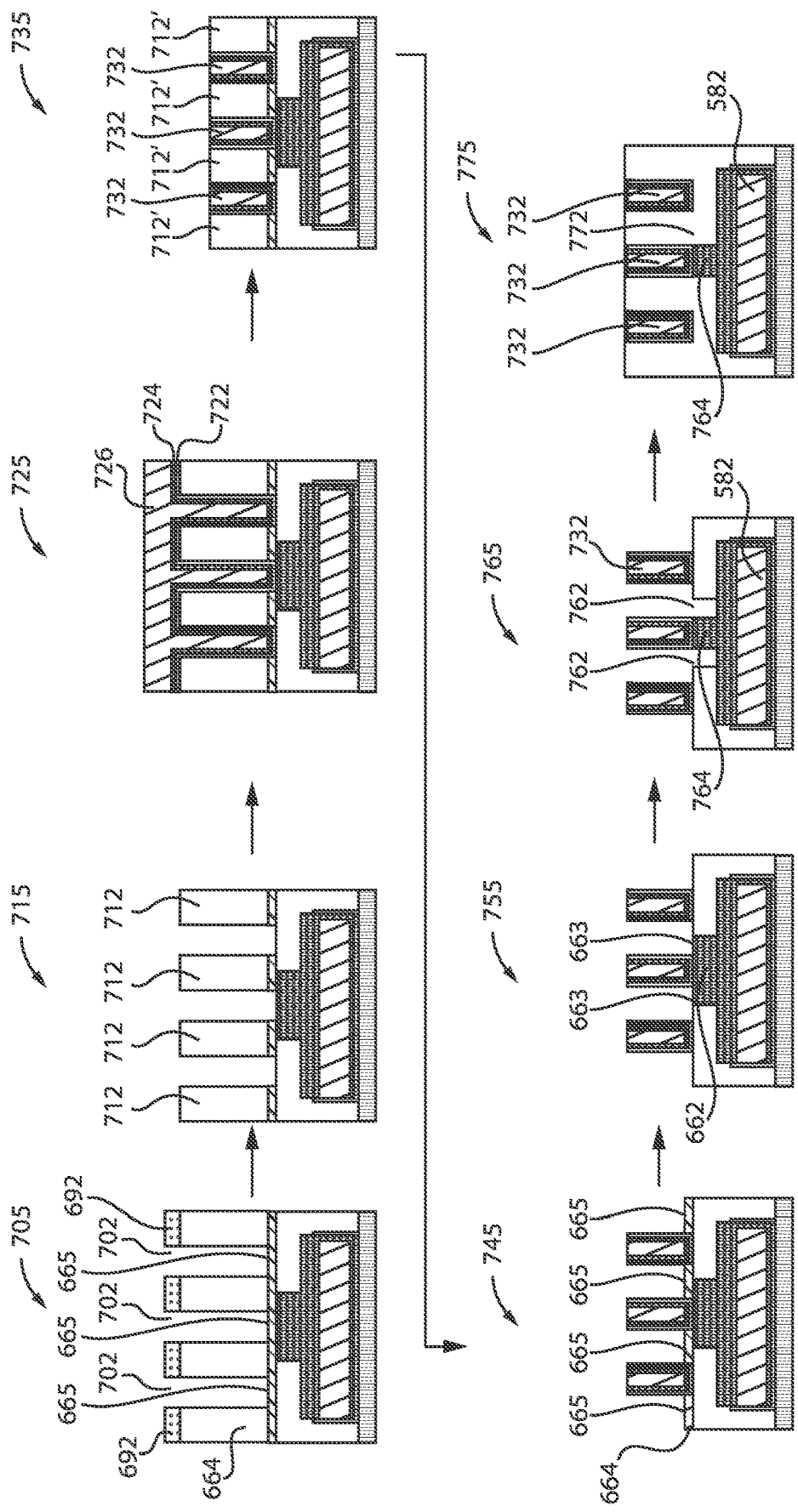
FIG. 12 is a continued process flow of the damascene-based integration scheme of FIGS. 10 and 11 with top-via trim to create fully-aligned top-via interconnects where the top-via trim is created, in accordance with an embodiment of the present invention.

FIG. 12 is a continued process flow of the damascene-based integration scheme of FIGS. 10 and 11 with top-via trim to create fully-aligned top-via interconnects where the top-via trim is created, in accordance with an embodiment of the present invention.

In structure 705, the dielectric 672 is etched. This results in openings 702 formed between the HM portions 692. Additionally, a top surface 665 of the NBLOK cap 664 is exposed.

In structure 715, the HM portions 692 are removed to reveal the dielectric sections 712. Additionally, the exposed NBLOK cap 664 sections are removed to expose the top surface of the dielectric 602.

In structure 725, a barrier layer 722, a liner 724, and a conductive material 726 are deposited. The conductive material 726 forms the M2 layer.

In structure 735, the conductive material 726 is planarized such that metal regions 732 remain. Additionally, the remaining dielectric can be referred to as dielectric regions 712'. The metal regions 732 can be referred to as the "M2" layer.

In structure 745, the dielectric regions 712' are removed to expose a top surface 665 of the NBLOK cap 664.

In structure 755, the remaining NBLOK cap 664 portions are removed to expose a top surface 663 of the V1 metal 662.

In structure 765, the exposed areas of the V1 metal 662 are recessed to form gaps or openings 762. The gaps or openings 762 are formed on opposed ends of a metal region 732. This is the via trim, which can be a partial etch or a full etch. Either way, shorting to adjacent lines is avoided and via resistance is improved. Thus, the via 764 (V1) can connect the conductive line 582 to the metal regions 732.

In structure 775, a dielectric 772 is deposited and planarized to expose a top surface of the metal regions 732.

In summary, fully-aligned top-via interconnect refers to top-via interconnects with vias perfectly or accurately, in a satisfactory manner, aligned to both the line above and the line below even with patterning misalignment. The ability to achieve fully-aligned top-vias minimizes via resistance and/or frequency degradation due to patterning misalignment. Two integration schemes are introduced to create or build such interconnect structures. One integration scheme is based on subtractive etching and another integration scheme is based on a damascene process. This exemplary fully-aligned via structure is compatible not only with Cu-based interconnects, but also with any other metals as well, such as Ru, Co, W, Ir, Rh, Pt. This exemplary structure is also compatible with interconnects where vias and lines are made with different materials (e.g., lines made of Cu and vias made of Ru).

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Regarding FIGS. 1-12, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for methods and devices for constructing fully-aligned top-via structures with top-via trim (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing fully-aligned top-via interconnects by employing a subtractive etch process, the method comprising:
    building a first metallization stack over a substrate, the first metallization stack including a first etch stop layer;
    depositing a first lithography stack over the first metallization stack;
    etching the first lithography stack and the first metallization stack to form a receded first metallization stack;
    depositing a first dielectric adjacent the receded first metallization stack;
    building a second metallization stack over the first dielectric and the receded first metallization stack, the second metallization stack including a second etch stop layer;
    depositing a second lithography stack over the second metallization stack;
    etching the second lithography stack and the second metallization stack to form a receded second metallization stack; and
    trimming the receded first metallization stack to form a via connecting the receded first metallization stack to the receded second metallization stack, a top surface of the via directly contacting a bottom surface of the second etch stop layer of the receded second metallization stack.

2. The method of claim 1, further comprising depositing a second dielectric adjacent the receded second metallization stack.

3. The method of claim 1, wherein the receded first metallization stack is perpendicular to the receded second metallization stack.

4. The method of claim 1, wherein the second etch stop layer directly contacts a top surface of the first dielectric.

5. The method of claim 1, wherein a metal layer of the receded first metallization stack is fully etched.

6. The method of claim 1, wherein a metal layer of the receded first metallization stack is partially etched to expose the second etch stop layer.

7. The method of claim 1, wherein the receded first metallization stack and the receded second metallization stack define fin patterns extending across a length of the substrate.

8. The method of claim 1, wherein the receded first metallization stack defines a single fin pattern and the receded second metallization stack defines a single fin pattern.

9. The method of claim 1, wherein the receded first metallization stack defines a dual fin pattern and the receded second metallization stack defines a dual fin pattern.

10. The method of claim 9, wherein one fin of the dual fin pattern of the receded first metallization stack has a stepped configuration and one fin of the dual fin pattern of the receded second metallization stack has a stepped configuration.

11. The method of claim 9, wherein the fins of the receded first metallization stack have a different height with respect to each other and the fins of the receded second metallization stack have a different height with respect to each other.

12. The method of claim 9, wherein a metal layer of one fin of the dual fin pattern of the receded first metallization stack is fully etched.

13. The method of claim 9, wherein a metal layer of one fin of the dual fin pattern of the receded first metallization stack is partially etched to expose an etch stop layer.

14. A semiconductor structure for constructing fully-aligned top-via interconnects by employing a subtractive etch process, the semiconductor structure comprising:
   a receded first metallization stack formed over a substrate, the receded first metallization stack including a first etch stop layer;
   a receded second metallization stack formed over the receded first metallization stack, the receded second metallization stack including a second etch stop layer; and
   a via disposed at a top portion of the receded first metallization stack for connecting the receded first metallization stack to the receded second metallization stack, a top surface of the via directly contacting a bottom surface of the second etch stop layer of the receded second metallization stack.

15. The semiconductor structure of claim 14, wherein the receded first metallization stack is perpendicular to the receded second metallization stack.

16. The semiconductor structure of claim 14, wherein the second etch stop layer directly contacts a top surface of the first dielectric.

17. The semiconductor structure of claim 14, wherein the receded first metallization stack and the receded second metallization stack define fin patterns extending across a length of the substrate.

* * * * *